US009066368B2

(12) United States Patent
Lorenz et al.

(10) Patent No.: US 9,066,368 B2
(45) Date of Patent: Jun. 23, 2015

(54) METHOD OF CALIBRATING THE DELAY OF AN ENVELOPE TRACKING SIGNAL

(75) Inventors: Robert Lorenz, Menlo Park, CA (US); Sumant Ranganathan, Saratoga, CA (US); Xinyu Yu, San Jose, CA (US); Sriraman Dakshinamurthy, San Jose, CA (US)

(73) Assignee: Broadcom Corporation, Irvine, CA (US)

( * ) Notice: Subject to any disclaimer, the term of this patent is extended or adjusted under 35 U.S.C. 154(b) by 257 days.

(21) Appl. No.: 13/491,184

(22) Filed: Jun. 7, 2012

(65) Prior Publication Data

US 2013/0109441 A1     May 2, 2013

Related U.S. Application Data

(60) Provisional application No. 61/494,846, filed on Jun. 8, 2011, provisional application No. 61/611,723, filed on Mar. 16, 2012.

(51) Int. Cl.
*H04W 88/02*     (2009.01)
*H04B 1/04*     (2006.01)
(Continued)

(52) U.S. Cl.
CPC ............. *H04W 88/02* (2013.01); *H04B 1/0483* (2013.01); *H04B 2001/0425* (2013.01); *H03F 1/0227* (2013.01); *H03F 3/193* (2013.01); *H03F 3/245* (2013.01)

(58) Field of Classification Search
CPC ....... H03F 1/0227; H03F 3/193; H03F 3/245; H03F 3/189; H03F 3/20; H03F 3/21; H03F 3/213; H03F 3/217; H03F 3/2171; H03F 3/19; H03F 3/183; H03F 3/185; H03F 3/1855

USPC .......... 455/571, 114.3, 217.1, 425, 13.4, 522, 455/572, 574, 115.1, 125, 126, 127.1; 330/127, 149, 10, 296; 375/224, 149, 375/343, 354, 355, 340, 148, 145, 150, 375/359; 341/61
See application file for complete search history.

(56) References Cited

U.S. PATENT DOCUMENTS 6,407,634 B1    6/2002   Staudinger et al.
6,792,059 B2 *   9/2004   Yuan et al. .................... 375/354
(Continued)

OTHER PUBLICATIONS

International Preliminary Report on Patentability with Written Opinion directed toward related International Application No. PCT/US2012/041573, dated Dec. 10, 2013, from The International Bureau of WIPO, Geneva, Switzerland; 10 pages.
(Continued)

*Primary Examiner* — Tan Trinh
(74) *Attorney, Agent, or Firm* — Sterne, Kessler, Goldstein & Fox P.L.L.C.

(57) ABSTRACT

Embodiments provide systems and methods for aligning the supply voltage signal applied to a power amplifier (PA) with the radio frequency (RF) output signal of the PA in a wireless device. The RF output signal is generated by applying a transmit signal to a transmit path of the wireless device. The supply voltage is generated by applying an envelope tracking (ET) signal, based on the transmit signal, to an envelope tracking (ET) path of the wireless device. Embodiments operate by estimating the delays of the ET path and the transmit path, and then controlling a relative delay between the transmit signal and the ET signal accordingly. In an embodiment, estimation of the delays of the ET path and the transmit path is done by correlating respective signals of each path.

21 Claims, 7 Drawing Sheets

(51) Int. Cl.
*H03F 1/02* (2006.01)
*H03F 3/193* (2006.01)
*H03F 3/24* (2006.01)

(56) References Cited

U.S. PATENT DOCUMENTS

| | | | |
|---|---|---|---|
| 7,026,868 B2 | 4/2006 | Robinson et al. | |
| 7,190,709 B2 * | 3/2007 | Eckhardt et al. | 375/145 |
| 8,094,764 B2 * | 1/2012 | Lackey | 375/354 |
| 8,411,809 B2 * | 4/2013 | Lackey | 375/354 |
| 8,571,154 B1 * | 10/2013 | Lackey | 375/347 |
| 8,718,579 B2 * | 5/2014 | Drogi | 455/126 |
| 2002/0101912 A1 * | 8/2002 | Phelts et al. | 375/148 |
| 2005/0110562 A1 * | 5/2005 | Robinson et al. | 330/10 |
| 2006/0199553 A1 | 9/2006 | Kenington | |
| 2007/0121708 A1 * | 5/2007 | Simpson | 375/149 |
| 2009/0004981 A1 * | 1/2009 | Eliezer et al. | 455/127.1 |
| 2009/0045872 A1 * | 2/2009 | Kenington | 330/127 |
| 2009/0097591 A1 | 4/2009 | Kim | |
| 2009/0302938 A1 * | 12/2009 | Andersen et al. | 330/10 |
| 2010/0233977 A1 * | 9/2010 | Minnis et al. | 455/127.1 |
| 2011/0058601 A1 | 3/2011 | Kim et al. | |
| 2012/0056677 A1 * | 3/2012 | Zhu et al. | 330/296 |
| 2012/0202435 A1 * | 8/2012 | Kim et al. | 455/69 |
| 2013/0034139 A1 * | 2/2013 | Khlat et al. | 375/224 |
| 2013/0109442 A1 * | 5/2013 | Dakshinamurthy et al. | 455/571 |
| 2013/0231069 A1 * | 9/2013 | Drogi | 455/114.3 |
| 2014/0235185 A1 * | 8/2014 | Drogi | 455/114.2 |

OTHER PUBLICATIONS

International Search Report for PCT Application No. PCT/US2012/041573, dated Aug. 27, 2012, 16 pages.

Supplementary European Search Report directed toward related EP Application No. 12726713.6, dated Nov. 3, 2014, from the European Patent Office, Munich, Germany; 3 pages.

* cited by examiner

METHOD OF CALIBRATING THE DELAY OF AN ENVELOPE TRACKING SIGNAL

CROSS-REFERENCE TO RELATED APPLICATIONS

The present invention claims the benefit of U.S. Provisional Application No. 61/494,846, filed Jun. 8, 2011, and U.S. Provisional Application No. 61/611,723, filed Mar. 16, 2012, both of which are incorporated herein by reference in their entireties.

BACKGROUND

1. Field of the Invention

The present invention relates generally to radio frequency (RF) transceivers.

2. Background Art

In a wireless device, the power efficiency of a power amplifier (PA) can be increased by having the supply voltage signal provided to the PA track the instantaneous power being produced by the PA. This, however, requires close timing alignment between the supply voltage signal and the RF output signal of the PA. A timing mismatch between the two signals can lead to clipping/distortion in the desired RF output signal and increased unwanted out-of-band emissions by the wireless device.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will be described with reference to the accompanying drawings. Generally, the drawing in which an element first appears is typically indicated by the leftmost digit(s) in the corresponding reference number.

DETAILED DESCRIPTION OF EMBODIMENTS

Figure 1:
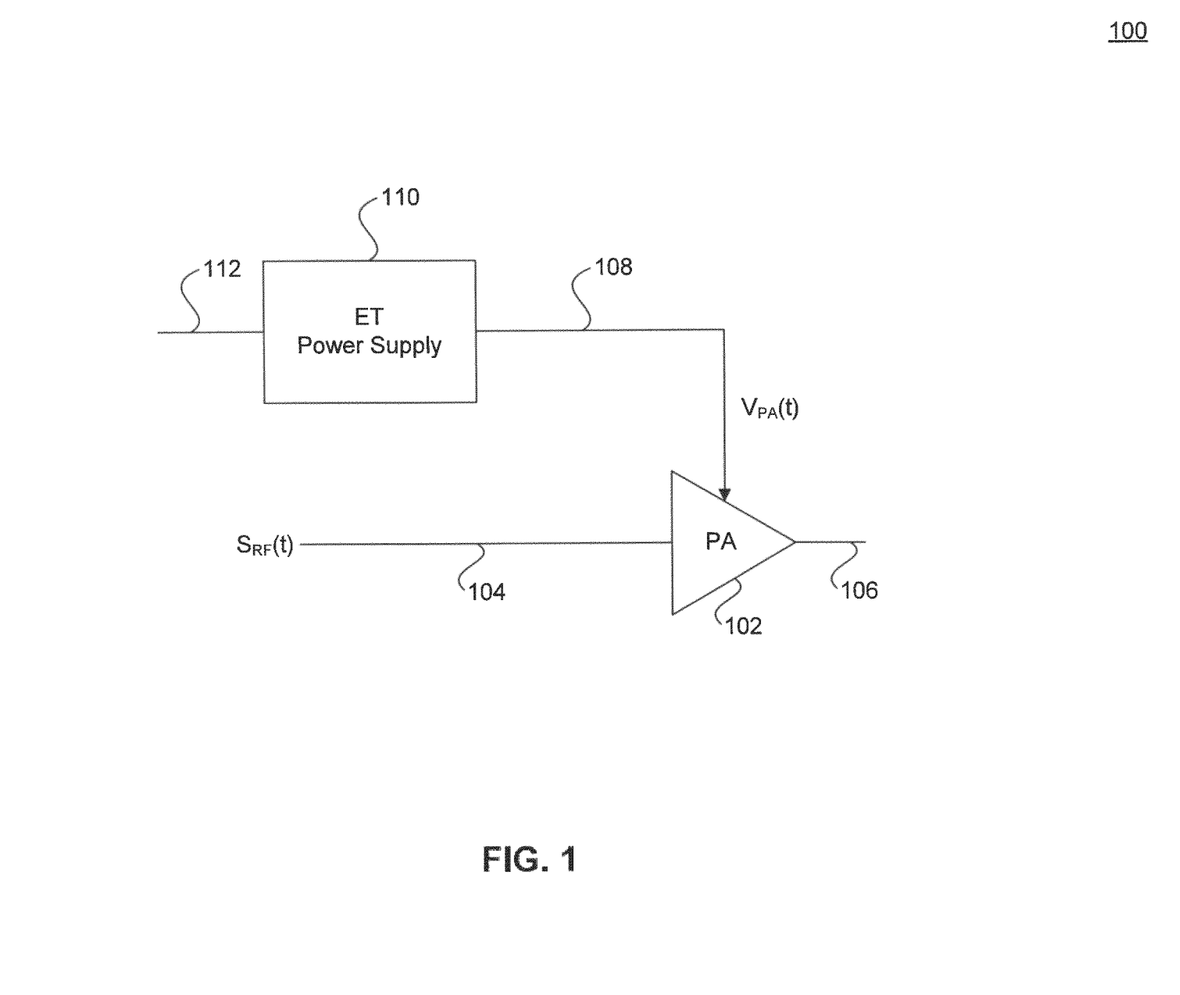
FIG. 1 illustrates an example power amplifier (PA) according to an embodiment of the present invention.

FIG. 1 illustrates an example power amplifier (PA) 102 according to an embodiment of the present invention. PA 102 may be part of a transmit path of a wireless transceiver device, for example.

As shown in FIG. 1, PA 102 receives a radio frequency (RF) input signal 104 and generates a RF output signal 106. RF input signal 104 is typically generated by up-converting a complex (having in-phase (I) and quadrature (Q) components) baseband transmit signal (not shown in FIG. 1) to RF. The transmit signal is typically produced by a baseband processor (not shown in FIG. 1) of the wireless device to generate a desired output waveform at RF output signal 106.

Instead of receiving a fixed supply voltage (e.g., $V_{DD}$), PA 102 receives a supply voltage 108 from an envelope tracking (ET) power supply 110. ET power supply 110 generates PA supply voltage 108 based on an ET signal 112. Typically, ET signal 112 is generated by the baseband processor or an RF transceiver, and has a known relationship to the transmit signal or, correspondingly, the desired output waveform. In an embodiment, ET signal 112 is related to the envelope (e.g., scaled and/or offset version of the envelope) of the desired transmit signal. As such, ET power supply 110 dynamically regulates PA supply voltage 108 according to the desired output waveform.

By having PA supply voltage 108 track the envelope of the desired transmit signal, PA 102 is supplied with just as much voltage as instantaneously necessary to produce the desired output waveform. As such, the power efficiency of PA 102 can be significantly enhanced. Accordingly, however, there is a need to align PA supply voltage 108 with RF input signal 104 (or, correspondingly, RF output signal 106) so that the instantaneous value of PA supply voltage 108 corresponds to the instantaneous desired output power of RF output signal 106 to be produced by PA 102.

Figure 2:
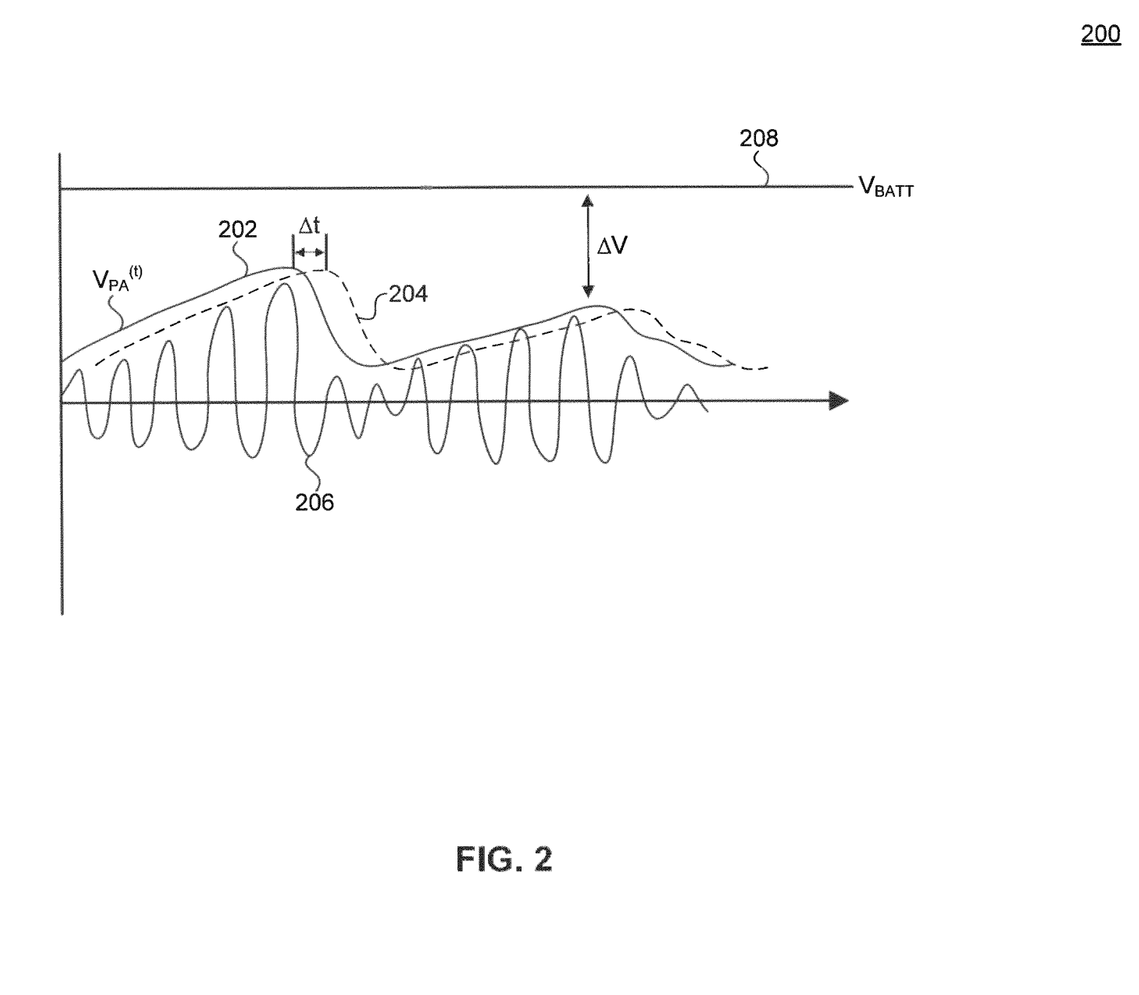
FIG. 2 is an example that illustrates the effect of timing misalignment between the PA supply voltage and the radio frequency (RF) input signal to the PA.

FIG. 2 is an example 200 that illustrates the effect of timing misalignment between the (envelope tracking) supply voltage and the desired RF output signal of a PA. In example 200, waveform 206 represents the desired RF output signal of the PA in the time domain. RF output signal 206 may be, for example and without limitation, a WiMAX (Worldwide Interoperability for Microwave Access) or a LTE (Long Term Evolution) waveform, with a high peak to average power ratio (PAPR).

Supply voltage curve 202 represents an ideal PA supply voltage that tracks waveform 206, so that at any time instant the PA is provided with the necessary and sufficient voltage to produce (without non-linear distortion) the desired output power of the desired RF output signal. Accordingly, as shown in FIG. 2, supply voltage 202 is time aligned with waveform 206.

In addition, supply voltage 202 may be such that the PA is provided a small headroom (typically few hundred milli-Volts) above what is needed to maintain linearity of waveform 206. This headroom accounts for any temperature, process, or load impedance variations that may affect the performance of the PA. As such, the power dissipation of the PA is reduced, and, consequently, its power efficiency is increased.

Supply voltage curve 204 represents an actual PA supply voltage in case of a timing misalignment between the envelope tracking PA supply voltage and the desired RF output signal of the PA. Time misalignment between the PA supply voltage and the RF output signal of the PA may be due to a variety of reasons, including temperature, process, and part to part variations.

As shown in FIG. 2, supply voltage 204 is time shifted by an amount "Δt" relative to supply voltage 202, and hence is time misaligned with waveform 206. As a result, despite the added headroom, supply voltage 204 may be, at certain time instants, below what is necessary to produce the instantaneous desired output power of waveform 206. When this occurs, the gain of the PA sags, resulting in clipping/distortion in the desired RF output signal of the PA and increased unwanted out-of-band emissions by the PA.

The above described problem becomes more pronounced in the case of waveforms with high PAPR (e.g., WiMAX, LTE, etc.), with timing misalignment causing frequent clipping at the peaks of such waveforms. Although the problem can be lessened by increasing the added headroom, this results in lower PA power efficiency. Accordingly, there is a need to closely align the envelope tracking supply voltage and the desired RF output signal of a PA.

Embodiments of the present invention, as further described below, provide systems and methods for aligning the supply voltage signal applied to a power amplifier (PA) with the radio frequency (RF) output signal of the PA in a wireless device. The RF output signal is generated by applying a transmit signal to a transmit path of the wireless device. In an embodiment, the supply voltage is generated by applying an envelope tracking (ET) signal, based on the transmit signal, to an envelope tracking (ET) path of the wireless device. Embodiments operate by estimating the delays of the ET path and the transmit path, and then controlling a relative delay between the transmit signal and the ET signal accordingly. In an embodiment, estimation of the delays of the ET path and the transmit path is done by correlating respective signals of each path.

In the following, example embodiments will be provided. These example embodiments are provided for the purpose of illustration and are not limiting. Embodiments will be described with reference to an example transmitter having a particular architecture. Specifically, the example transmitter uses a receiver feedback path and an envelope tracking PA supply. However, embodiments are not limited to this example transmitter, and can be extended to other transmitter architectures as would be understood by a person of skill in the art based on the teachings herein.

Figure 3:
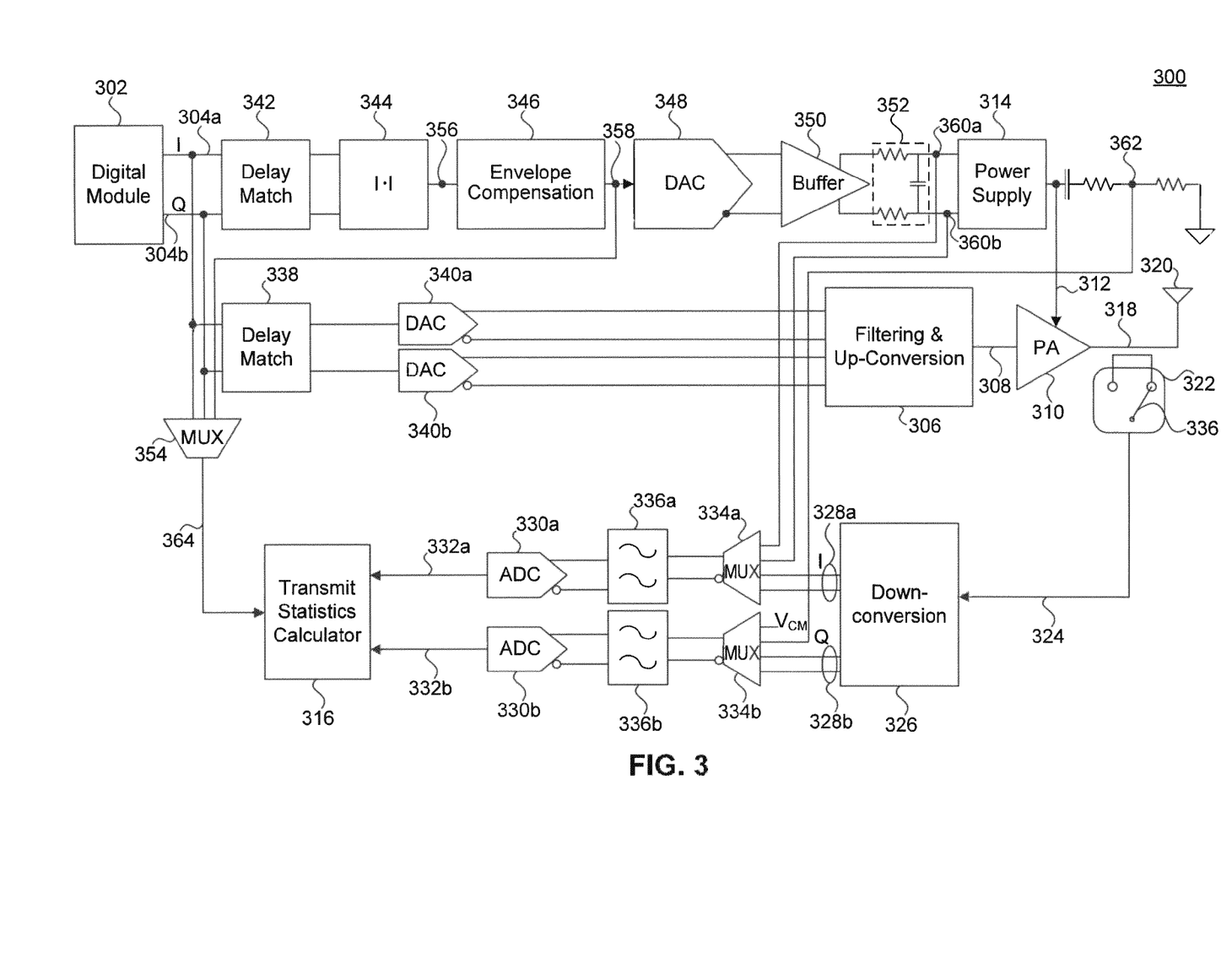
FIG. 3 illustrates an example RF transmitter according to an embodiment of the present invention.

FIG. 3 illustrates an example RF transmitter 300 according to an embodiment of the present invention. Example transmitter 300 can be used to perform embodiments of the present invention. As would be understood by a person of skill in the art based on the teachings herein, transmitter 300 may include more components than shown in FIG. 3, which are omitted herein for the purpose of simplification.

As shown in FIG. 3, example transmitter 300 includes a digital module 302; a transmit path, including delay match module 338, digital-to-analog converters (DACs) 340a-b, filtering and up-conversion module 306, and PA 310; an antenna 320; a Cartesian feedback path, including directional coupler 322 and down-conversion module 326; an envelope tracking (ET) path, including envelope compensation module 346, DAC 348, buffer module 350, impedance network 352, and power supply 314.

Additionally, transmitter 300 includes, between digital module 302 and the ET path, a delay match module 342 and an envelope generator module 344. Further, transmitter 300 includes a transmit statistics calculator module 316. As input interfaces to transmit statistics calculator module 316, transmitter 300 includes a multiplexer 354, and a feedback interface path, comprised of multiplexers 334a-b, filters 336a-b, and analog-to-digital converters (ADCs) 330a.

Digital module 302, which may be a baseband processor, generates digital in-phase (I) and quadrature-phase (Q) signals 304a and 304b based on an input signal to be transmitted. Signals 304a-b represent the transmit signal. Digital module 302 simultaneously provides signals 304a-b to delay match module 342, delay match module 338, and multiplexer 354. In an embodiment, digital module 302 may pre-distort I and Q signals 304a and 304b to compensate for non-linearities in module 306 and PA 310. In embodiments, digital module 302 may be implemented using hardware and/or software components.

In the transmit path, delay match 338 passes signals 304a-b, optionally after introducing a determined delay as further described below, to DACs 304a-b. DACs 304a-b convert signals 304a-b, respectively, from digital to analog, and provide the analog converted signals to filtering and up-conversion module 306. Filtering and up-conversion module 306 performs filtering (e.g., interpolation filtering) and frequency up-conversion on the analog signals, and then sums the resulting signals to generate RF signal 308.

PA 310 receives RF signal 308 from filtering and up-conversion module 306, and power amplifies RF signal 308 to generate an RF output signal 318 for transmission by antenna 320. In addition, PA 310 receives a supply voltage 312 from power supply 314. In an embodiment, power supply 314 is an envelope tracking (ET) power supply that generates supply voltage 312 based on an envelope tracking signal. The ET signal has a known relationship to the transmit signal, or, correspondingly, the desired output waveform of RF transmitter 300. As such, power supply 314 dynamically regulates PA supply voltage 312 according to the instantaneous power level of the desired output waveform, thereby allowing PA 310 to operate at high power efficiency. In an embodiment, PA 310 includes a field-effect transistor (FET), and supply voltage 312 is applied to a drain terminal of the FET.

To generate supply voltage 312, the transmit signal (I and Q signals 304a and 304b) is used to generate an ET signal, which then is applied to the ET path. Specifically, I and Q signals 304a-b are passed through delay match module 342 and then applied to envelope generator module 344 to produce ET signal 356. Envelope generator module 344 computes the envelope or magnitude ($|I^2+Q^2|$) of the transmit signal.

Signal 356 is then applied to envelope compensation module 346, which applies an appropriate compensation (e.g., scaling and/or offsetting) to ET signal 356, to produce a compensated ET signal 358. Signal 358 is then converted from digital to analog using DAC 348, and the analog switch is provided via signals 360a-b to power supply 314, after being applied to buffer 350 and impedance network 352.

Power supply 314 uses signals 360a-b to generate PA supply voltage 312. As such, supply voltage 312 tracks the envelope of the desired transmit signal, and PA 310 is supplied with just as much voltage as instantaneously necessary to produce the desired output waveform. Accordingly, the power efficiency of PA 102 is greatly enhanced.

However, as described above, there is a need to align PA supply voltage 312 with RF input signal 308 (or, correspondingly, RE output signal 318) so that the instantaneous value of PA supply voltage 312 corresponds to the instantaneous desired output power of RE output signal 318 to be produced by PA 310. Without close timing alignment, supply voltage 312 may be, at certain time instants, below what is necessary to produce the instantaneous desired output power of RF output signal 318. When this occurs, the gain of PA 310 sags, resulting in clipping/distortion in the desired RF output signal and increased unwanted out-of-band emissions by transmitter 300.

Generally, the exact delay of power supply 314 is uncertain, as it may vary with process and temperature variations. In addition, impedance network 352 may introduce some delay uncertainty. Typically, impedance network 352 is comprised of parasitic elements, which introduce a frequency dependent phase shift. As such, the delay of the ET path may vary during operation, precluding solutions based on a priori characterization and measurement of the transmit and ET paths delays.

Embodiments provide systems and methods for aligning PA supply voltage Signal 312 with radio frequency (RF) output signal 308 of PA 310. Embodiments include estimating the delays of the ET path and the transmit path, and then controlling a relative delay between the transmit signal and the ET signal accordingly. The alignment process is performed during the operation of the RE transmitter, at periodic intervals, for example. In an embodiment, estimation of the delays of the ET path and the transmit path is done by correlating respective signals of each path, as further described below.

The alignment process, in an embodiment, is enabled by the Cartesian feedback path, which includes directional coupler 322 and down-conversion module 326, the feedback interface path, which includes multiplexers 334*a-b*, filters 336*a-b*, and analog-to-digital converters (ADCs) 330*a*, and transmit statistics calculator 316.

As shown in FIG. 3, directional coupler 322 is coupled to the output of PA 310 so as to receive output signal 318 of PA 310 and generate a RF signal 324. A controllable switch 336 within coupler 322 allows either a forward coupled port or a reverse coupled port of coupler 322 to be sampled. As such, directional coupler 322 can be used to measure either the forward or reflected signal components (both amplitude and phase) present in output signal 318 of PA 210. According to embodiments, directional coupler 322 is controlled so as to measure the forward signal components at the output of PA 310, from which a feedback signal is generated.

RF signal 324 is provided to down-conversion module 326, which frequency down-converts RF signal 324 and generates baseband analog I and Q signals 328*a* and 328*b*. I and Q signals 328*a-b* represent the feedback signal. I and Q signals 328*a-b* are provided, respectively, to multiplexers 334*a* and 334*b* of the feedback interface path. When selected by multiplexers 334*a* and 334*b*, I and Q signals 328*a-b* are passed through respective filters 336*a-b* and then converted from analog to digital by ADCs 330*a-b*, respectively. The resulting digital signals 332*a-b* are provided to transmit statistics calculator 316.

In an embodiment, the delay of the ET path is estimated by correlating supply voltage 312 applied to the PA with ET signal 358. In an embodiment, an output node 362 of power supply 314, having substantially identical voltage and delay characteristics as supply voltage 312, is coupled via the feedback interface path to transmit statistics calculator 316. Simultaneously, ET signal 358 is coupled via multiplexer 354 and signal 364 to transmit statistics calculator 316. In another embodiment, the ET signal is coupled before envelope compensation at node 356 of the ET path.

Transmit statistics calculator 316 correlates supply voltage 312 and ET signal 358 to estimate the delay of the ET path. In an embodiment, this includes delaying the ET signal by a delay amount to produce a delayed ET signal; correlating the supply voltage with the delayed ET signal to generate a correlation product. The correlation product may include a correlation (over a plurality of offsets) between the supply voltage and the delayed ET signal. The delay amount is then adjusted and the correlation repeated, until the correlation product is maximized. The delay amount that maximizes the correlation product represents the estimate of the delay of the ET path. In an embodiment, the delay amount is introduced using a delay matching circuit, for example, which may be inside or outside transmit statistics calculator 316.

In an embodiment, the correlation is maximized when it results in a maximum value for zero offset between the correlated signals. In an embodiment, the correlation is performed using an early-late discriminator module (not shown in FIG. 3), which is further described below in FIG. 4. In a further embodiment, the zero offset correlation is maximized and the early-minus-late correlation is minimized.

Similarly, the delay of the transmit path is estimated by correlating the feedback signal (I and Q signals 328*a-b*) with the transmit signal (I and Q signals 304*a-b*). Accordingly, I and Q signals 328*a-b* are coupled to transmit statistics calculator 316, by the feedback interface path, to generate digital signals 332*a-b*. Concurrently, via multiplexer 354 and signal 364 (which may include more than one signal), I and Q signals 304*a-b* are coupled to transmit statistics calculator 316. The same correlation process, as described above with respect to the supply voltage and ET signal, may be used to correlate the feedback signal and the transmit signal to estimate the delay of the transmit path.

Strictly, the estimated delay of the transmit path is an estimate of the delay of the concatenated transmit path and feedback path. Typically, the feedback path (which includes, directional coupler 322 and down-conversion module 326) includes broadband circuitry that introduces very small delay (which can be calibrated or ignored). For better accuracy, however, the delay estimate of the transmit path can be further refined by subtracting from it any delay due to the feedback path, thus resulting in a better estimate of the transmit path delay. The feedback path delay can be characterized a priori, for example. It is noted that since the feedback interface path (multiplexers 334*a-b*, filters 336*a-b*, and ADCs 330*a-b*) is common to both estimate calculations of the transmit path and the ET path, any delay associated with it can be ignored.

With estimates of the transmit path and the ET path computed, a delay difference between the transmit path and the ET path can be computed. This delay difference is then used to control a relative delay between the transmit signal and the ET signal to align PA supply voltage 312 and RF output signal 318. The relative delay between the transmit signal and the ET signal can be controlled using one or both of delay match modules 338 and 342. In an embodiment, the relative delay between the transmit signal and the ET signal is adjusted to bring the estimated delay difference between the transmit path and the ET path to zero.

In another embodiment, the delay of power supply 314 can be determined by estimating, using the same process described above, the delay in the ET path up to the input of power supply 314. This delay estimate is then subtracted from the delay estimate of the ET path to determine the delay of power supply 314. Accordingly, input signals 360*a* and 360*b* of power supply 314 are coupled, via the feedback interface path, to transmit statistics calculator 316, simultaneously with the ET signal. The signals are then correlated as described above.

The delay of power supply 314 is expected to be the largest delay component of the ET path. Accordingly, by estimating the power supply delay, the estimate can be used to calibrate the relative delay between the transmit path and the ET path accordingly. Subsequently, any differences in delay between the two paths will be due to temperature or process variations, and can be handled using small infrequent adjustments of the relative delay.

Figure 4:
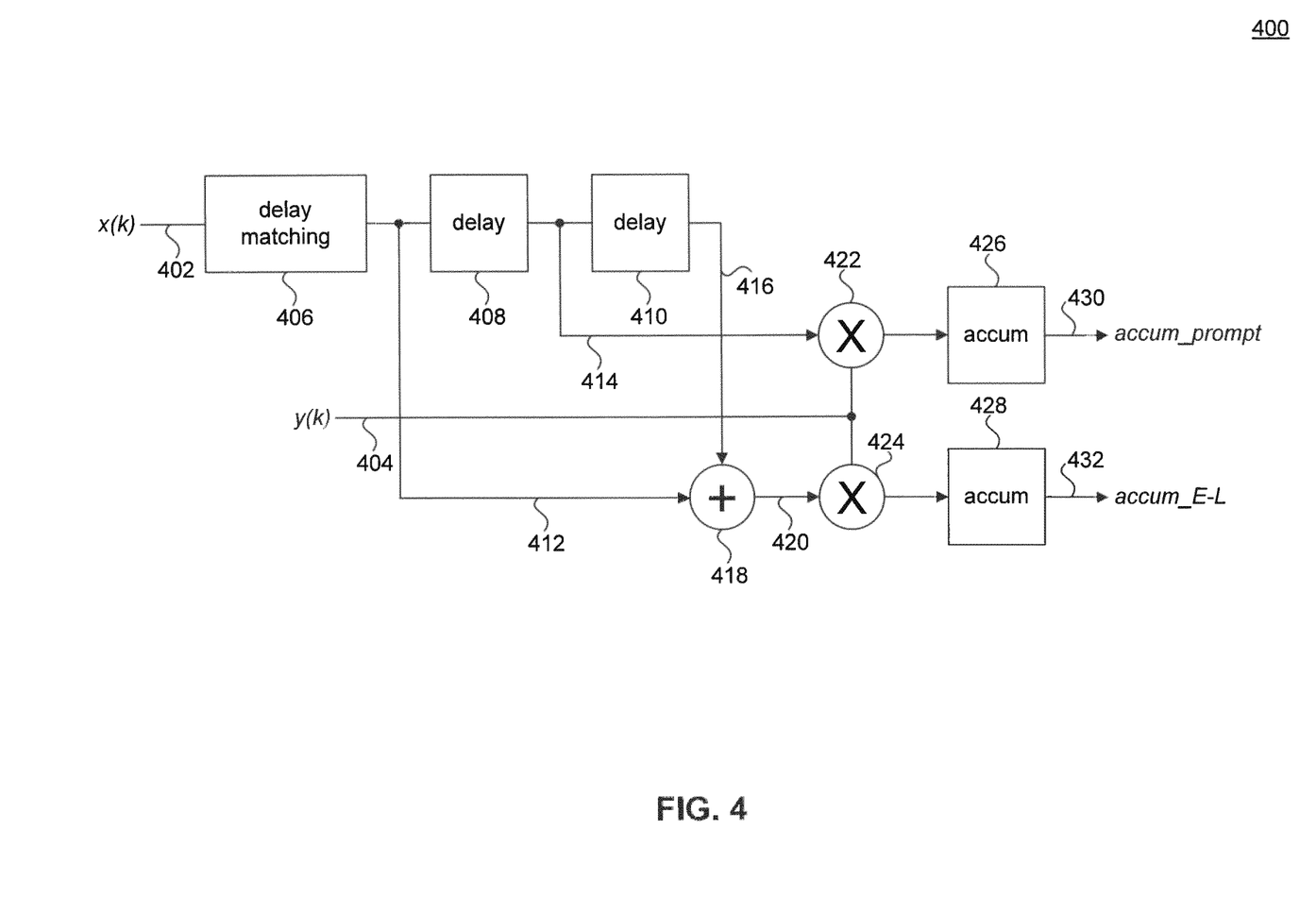
FIG. 4 illustrates an example early-late discriminator according to an embodiment of the present invention.

FIG. 4 illustrates an example early-late discriminator module 400 according to an embodiment of the present invention. Discriminator module 400 may be used in embodiments to perform the correlations between the PA supply voltage and the ET signal and/or between the transmit signal and the feedback signal as described above. Discriminator module 400 may be fully or partly integrated within transmit statistics calculator 316 of example RF transceiver 300.

Discriminator module 400 includes a delay matching circuit 406, delay elements 408 and 410, a summing module 418, multipliers 422 and 424, and accumulator modules 426 and 432. Discriminator module 400 receives input signals x(k) 402 and y(k) 404. Input signals x(k) 402 and y(k) 404 may be the ET signal and the PA supply voltage, respectively, or, the transmit signal and the feedback signal, respectively.

As shown in FIG. 4, discriminator module 400 generates early, prompt, and late versions 412, 414, and 416, respectively, of input signal x(k) 402 using delay matching circuit 406 and delay elements 408 and 410. Then, using multiplier 422, discriminator module 400 correlates the prompt version 414 of input signal x(k) 402 with input signal y(k) 404. Typically, the correlation involves correlating a number of samples of signal 414 with a corresponding number of samples of input signal y(k) 404. The correlation product is accumulated using accumulator module 426 to generate a prompt correlation accumulation 430.

Using summing module 418, discriminator module 400 generates a difference 420 between the early and late versions 412 and 416 of input signal x(k). The difference 420 is correlated using multiplier 424 with input signal y(k) 404. The correlation product is accumulated using accumulator module 428 to generate an early-minus-late correlation accumulation 432.

To estimate the delay between input signals x(k) 402 and y(k) 404, the output of discriminator 400, consisting of prompt correlation accumulation 430 and/or early-minus-late correlation accumulation 432, is observed, as the delay amount introduced by delay matching circuit 406 is varied. The delay amount for which early-minus-late correlation accumulation 432 is (or substantially is) equal zero and/or prompt correlation accumulation 430 is at a maximum value, for a zero offset between the correlated samples of the inputs, represents an estimate of the delay between input signals x(k) 402 and y(k) 404.

Figure 5:
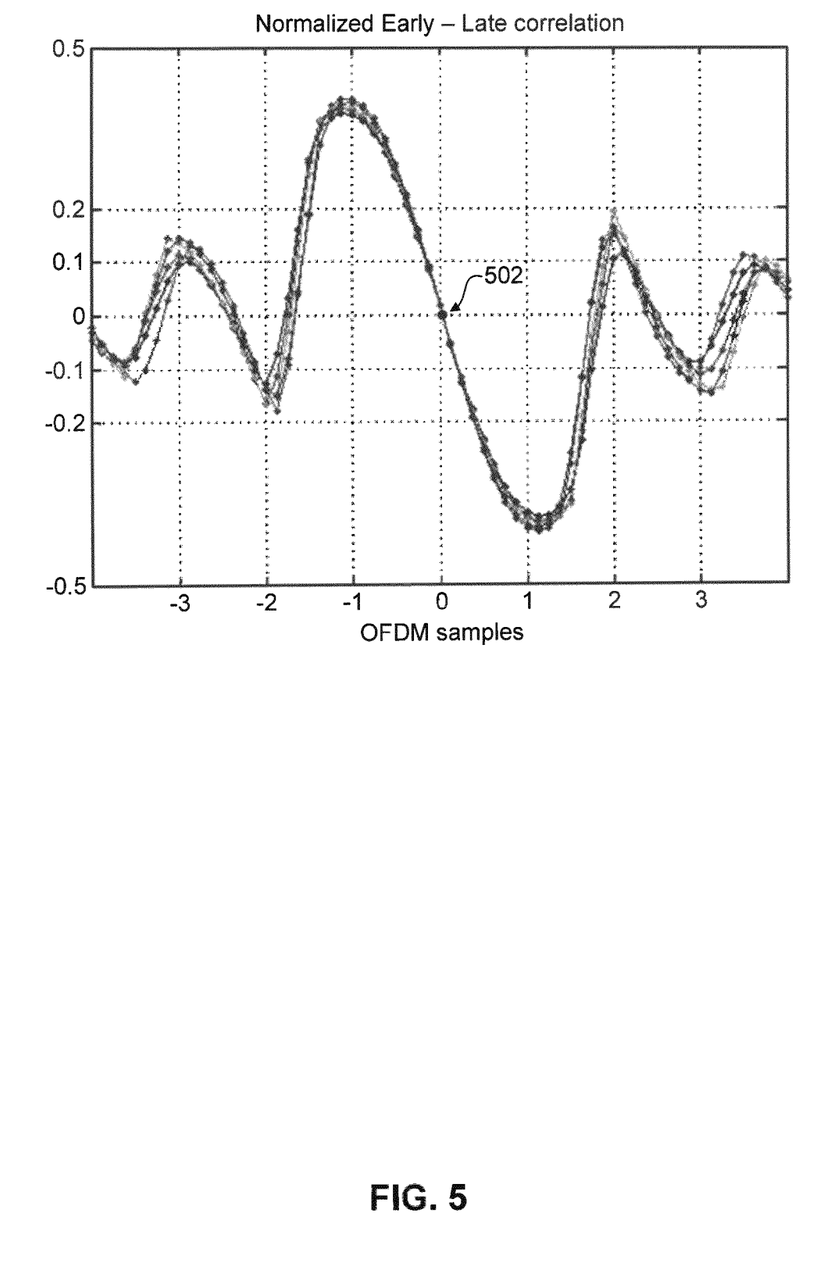
FIG. 5 illustrates an example output produced by an early-late discriminator for an OFDM signal, according to an embodiment of the present invention.

FIG. 5 illustrates an example output 500 of early-late discriminator module 400 according to an embodiment of the present invention. Example output 500 shows the early-minus-late correlation accumulation 430 resulting from a delay amount of delay matching circuit 406 that closely estimates the delay between input signals x(k) 402 and y(k) 404.

As shown in FIG. 5, for a zero offset between the correlated samples of the input signals (denoted by a point 502), the early-minus-late accumulation is substantially equal to zero, indicating a maximum correlation between the input signals. For the same offset value, the prompt accumulation (not shown in FIG. 5) will have a maximum value.

Figure 6:
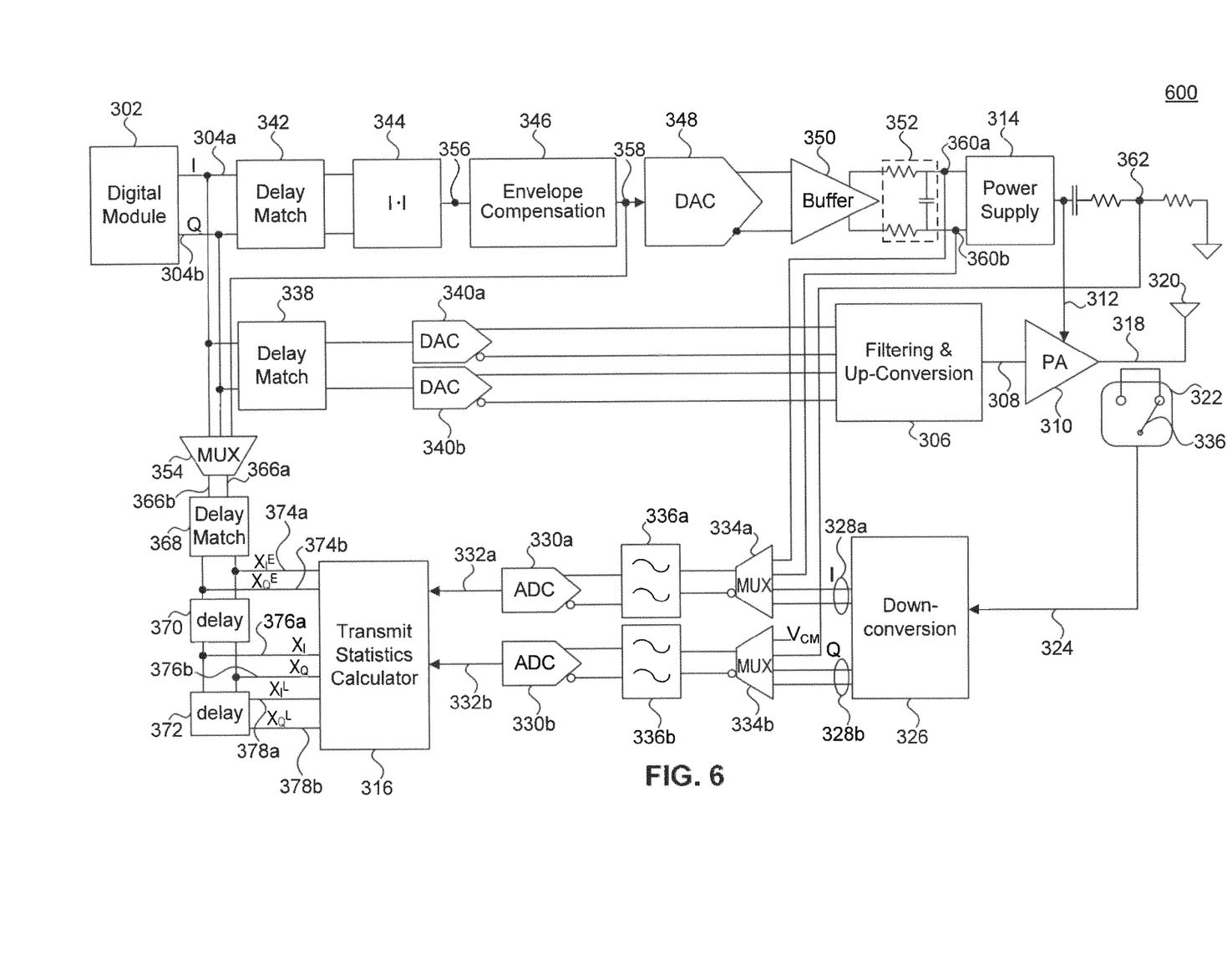
FIG. 6 is another example RF transmitter according to an embodiment of the present invention.

FIG. 6 is another example RF transmitter 600 according to an embodiment of the present invention. Example transmitter 600 is similar to example transmitter 300 described above.

In addition, example transmitter 600 implements an early-late discriminator, as described above in FIGS. 4 and 5. Specifically, example transmitter 600 includes a delay match module 368 and delay elements 370 and 372. These elements correspond respectively, for example, to delay matching circuit 406 and delay elements 408 and 410 in discriminator module 400 described above.

As shown in FIG. 6, when the transmit signal is coupled through multiplexer 354, these elements generate an early (signals 374a-b), prompt (signals 376a-b), and late (signals 378a-b) versions of the transmit signal. Similarly, the same elements can be used to generate an early, prompt, and late version of the ET signal. Delay match element 368 can be used to produce and adjust the delay amount for the correlations performed in transmit statistics calculator 316. The value of the delay amount in delay match element 368 that maximizes the correlation (for zero offset) between the signals being correlated corresponds to the path delay being estimated.

Figure 7:
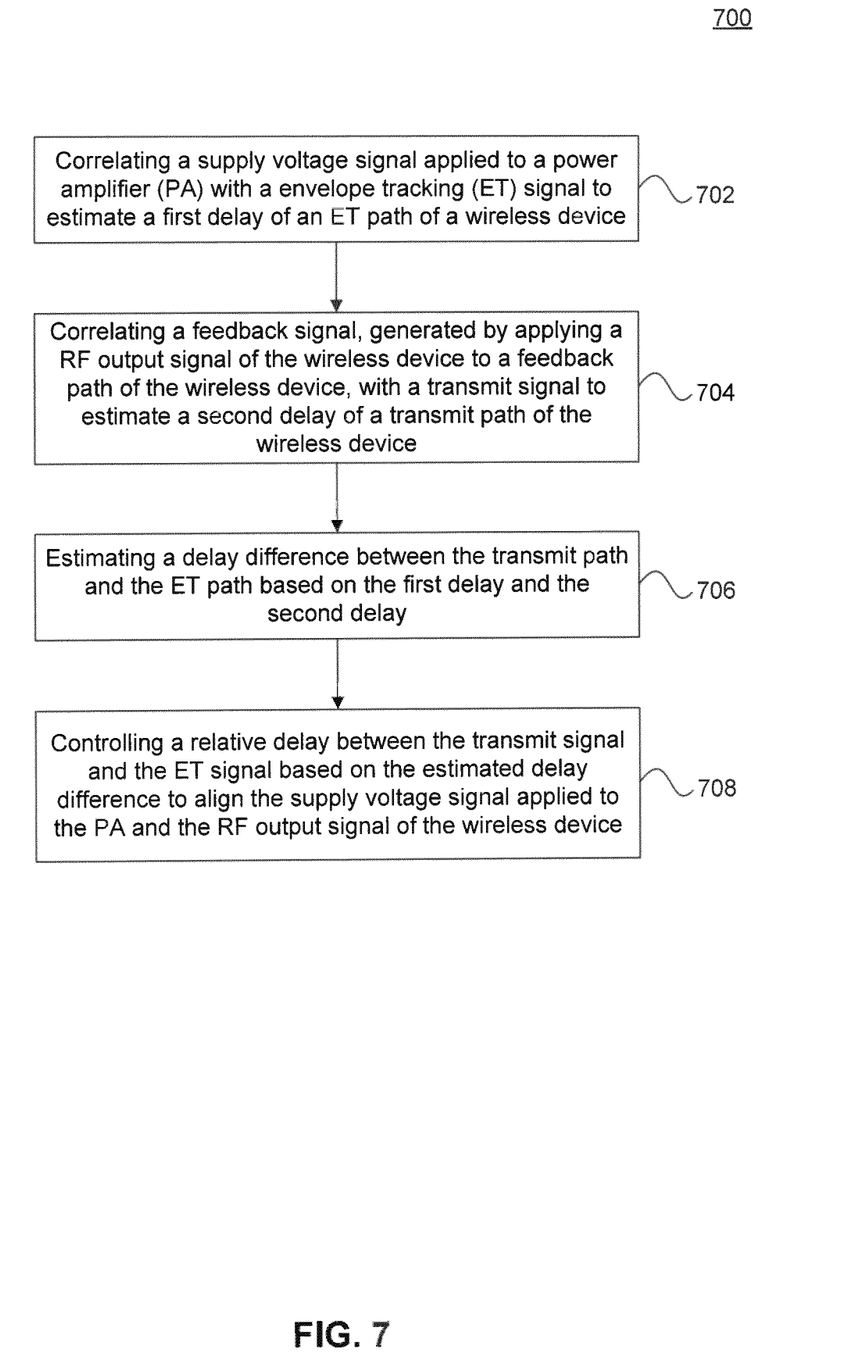
FIG. 7 is a process flowchart of a method for aligning a supply voltage signal applied to a PA with a RF output signal of the PA in a wireless device, according to an embodiment of the present invention.

FIG. 7 is a process flowchart 700 of a method for aligning a supply voltage signal applied to a PA with a RF output signal of the PA in a wireless device, according to an embodiment of the present invention. In an embodiment, the RF output signal of the PA is generated by applying a transmit signal (e.g., digital complex baseband signal) to a transmit path, including the PA, of the wireless device. The supply voltage signal is generated by applying an envelope tracking (ET) signal to an ET path of the wireless device. In an embodiment, as described above, the ET signal is based on the transmit signal. For example, the ET signal is related to the envelope of the transmit signal.

As shown in FIG. 7, process 700 begins in step 702, which includes correlating the supply voltage signal applied to the PA with the ET signal to estimate a first delay of the ET path of a wireless device. In an embodiment, correlating the supply voltage with the ET signal includes delaying the ET signal by a delay amount to produce a delayed ET signal; correlating the supply voltage signal with the delayed ET signal to generate a correlation product; and adjusting the delay amount until the correlation product is maximized.

In an embodiment, step 702 is performed using an early-late discriminator module. Accordingly, step 702 further includes generating an early, prompt, and late versions of the delayed ET signal, where the early, prompt, and late versions of the ET signal have respective delays relative to the ET signal; correlating the supply voltage signal with the prompt version of the delayed ET signal to generate a prompt correlation value; and correlating the supply voltage with a difference of the early and late versions of the delay ET signal to generate an early-minus-late correlation value. Subsequently, the delay amount is adjusted until the early-minus-late correlation value is substantially equal to zero and/or the prompt correlation value is at a maximum value. This indicates that the correlation product between the supply voltage and the delayed ET signal is maximized. The delay amount for which the correlation product between the supply voltage signal and the delayed ET signal is maximized represents the estimated delay of the ET path.

Process 700 continues at step 704, which includes correlating a feedback signal, generated by applying the RF output signal of the PA to a feedback path of the wireless device, with a transmit signal to estimate a second delay of a transmit path of the wireless device. In an embodiment, the feedback signal is a complex baseband signal generated by frequency down-converting and digitizing the RF output signal using the feedback path.

Correlating the feedback signal with the transmit signal can be performed using the same process described above for correlating the supply voltage signal applied to the PA with the ET signal. In an embodiment, the same system module (e.g., early-late discriminator module) is used to perform both correlation steps. As would be understood by a person of skill in the art based on the teachings herein, in other embodiments, steps 702 and 704 may be performed simultaneously or in an opposite order than described here.

Subsequently, process 700 proceeds to step 706, which includes estimating a delay difference between the transmit path and the ET path based on the first delay and the second delay. In an embodiment, the delay difference between the transmit path and the ET path is equal to the difference between the first delay and the second delay.

In another embodiment, step 706 further includes estimating a delay of the feedback path; and compensating the second delay of the transmit path based on the delay of the feedback path. Strictly, the second delay (estimated in step 704) is an estimate of the delay of the concatenated transmit path and feedback path. Typically, the feedback path (which includes, for example, a directional coupler and a down-conversion module) includes broadband circuitry that introduces very small delay (which can be calibrated or ignored). For better accuracy, however, the second delay estimate can be further refined by subtracting from it any delay due to the feedback path, thus resulting in a better estimate of the transmit path delay.

Finally, in step 708, process 700 includes controlling a relative delay between the transmit signal and the ET signal based on the estimated delay difference to align the supply voltage signal applied to the PA and the RF output signal of the wireless device. In an embodiment, step 708 includes controlling the relative delay between the transmit signal and the ET signal to bring the estimated delay difference to zero. In an embodiment, step 708 is performed by adjusting a delay element in the transmit path or the ET path to control the relative delay between the transmit signal and the ET signal, as desired.

Embodiments have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of embodiments of the present invention should not be limited by any of the above-described exemplary embodiments, but should be defined only in accordance with the following claims and their equivalents.

What is claimed is:

1. A method for aligning a supply voltage signal applied to a power amplifier (PA) with a radio frequency (RF) output signal of the PA in a wireless device, wherein the RF output signal is generated by applying a transmit signal to a transmit path of the wireless device, and wherein the supply voltage signal is generated by applying an envelope tracking (ET) signal, based on the transmit signal, to an ET path of the wireless device, the method comprising:
   correlating the supply voltage signal applied to the PA with the ET signal to estimate a first delay of the ET path;
   correlating a feedback signal generated by applying the RF output signal to a feedback path of the wireless device with the transmit signal to estimate a second delay of the transmit path;
   estimating a delay difference between the transmit path and the ET path based on the first delay and the second delay; and
   controlling a relative delay between the transmit signal and the ET signal based on the estimated delay difference to align the supply voltage signal applied to the PA and the RF output signal of the PA.

2. The method of claim 1, wherein correlating the supply voltage signal applied to the PA with the ET signal comprises:
   (a) delaying the ET signal by a delay amount to produce a delayed ET signal;
   (b) correlating the supply voltage signal with the delayed ET signal to generate a correlation product;
   (c) adjusting the delay amount and repeating steps (a)-(b), until the correlation product is maximized.

3. The method of claim 2, wherein step (b) comprises:
   generating early, prompt, and late versions of the ET signal, wherein the early, prompt, and late versions of the ET signal have respective delays relative to the ET signal;
   correlating the supply voltage signal with the prompt version of the ET signal to generate a prompt correlation value; and
   correlating the supply voltage with a difference of the early and late versions of the ET signal to generate an early-minus-late correlation value.

4. The method of claim 3, wherein the correlation product between the supply voltage signal and the delayed ET signal is maximized when the early-minus-late correlation value is substantially equal to zero.

5. The method of claim 3, wherein the correlation product between the supply voltage signal and the delayed ET signal is maximized when the prompt correlation value is at a maximum value.

6. The method of claim 2, wherein the delay amount for which the correlation product between the supply voltage signal and the delayed ET signal is maximized represents the estimated first delay of the ET path.

7. The method of claim 1, wherein the feedback signal is a complex baseband signal generated by frequency down-converting and digitizing the RF output signal.

8. The method of claim 1, wherein the ET path includes an ET power supply that produces the supply voltage signal applied to the PA based on the ET signal, the method further comprising:
   correlating an input signal of the ET power supply with the ET signal to estimate a third delay; and
   estimating a delay of the ET power supply as a difference between the first delay and the third delay.

9. The method of claim 1, wherein estimating the delay difference between the transmit path and the ET path comprises:
   estimating a delay of the feedback path; and
   compensating the second delay of the transmit path based on the delay of the feedback path.

10. The method of claim 1, wherein controlling the relative delay between the transmit signal and the ET signal to align the supply voltage signal applied to the PA and the RF output signal of the PA comprises:
    controlling the relative delay between the transmit signal and the ET signal to bring the estimated delay difference to zero.

11. The method of claim 1, wherein controlling the relative delay between the transmit signal and the ET signal to align the supply voltage signal applied to the PA and the RF output signal of the PA comprises:

adjusting a delay element in the transmit path or the ET path.

12. A wireless device, comprising:
   a transmit path, including a power amplifier (PA), that receives a transmit signal and generates a radio frequency (RF) output signal at an output of the PA;
   an envelope tracking (ET) path that receives an ET signal, based on the transmit signal, and generates a supply voltage signal applied to the PA;
   a feedback path that generates a feedback signal from the RF output signal; and
   means for aligning the supply voltage signal applied to the PA with the RF output signal,
   wherein the means for aligning comprises:
      means for correlating the supply voltage signal applied to the PA with the ET signal to estimate a first delay of the ET path;
   means for correlating the feedback signal with the transmit signal to estimate a second delay of the transmit path;
   means for estimating a delay difference between the transmit path and the ET path based on the first delay and the second delay; and
   means for controlling a relative delay between the transmit signal and the ET signal based on the estimated delay difference.

13. The wireless device of claim 12, wherein the feedback path generates the feedback signal by frequency down-converting and digitizing the RF output signal.

14. The wireless device of claim 12, wherein the means for correlating the supply voltage applied to the PA with the ET signal comprises:
   a delay matching circuit for delaying the ET signal by a delay amount to produce a delayed ET signal;
   a correlator for correlating the supply voltage signal with the delayed ET signal to generate a correlation product; and
   means for adjusting the delay amount until the correlation product is maximized.

15. The wireless device of claim 14, wherein the means for correlating the supply voltage applied to the PA with the ET signal comprises an early-late discriminator module.

16. The wireless device of claim 15, further comprising:
   means for generating early, prompt, and late versions of the ET signal, wherein the early, prompt, and late versions of the ET signal have respective delays relative to the ET signal; and
   a first mixer that correlates the supply voltage signal with the prompt version of the ET signal to generate a prompt correlation value; and
   a second mixer that correlates the supply voltage with a difference of the early and late versions of the ET signal to generate an early-minus-late correlation value.

17. The wireless device of claim 16, wherein the correlation product between the supply voltage signal and the delayed ET signal is maximized when the early-minus-late correlation value is substantially equal to zero.

18. The wireless device of claim 14, wherein the delay amount for which the correlation product between the supply voltage signal and the delayed ET signal is maximized represents the estimated first delay of the ET path.

19. The wireless device of claim 12, wherein the means for controlling the relative delay between the transmit signal and the ET signal comprises:
   an adjustable delay element in the transmit path or the ET path.

20. The wireless device of claim 12, wherein the ET path includes an ET power supply that generates the supply voltage signal applied to the PA based on the ET signal, the wireless device further comprising:
   means for correlating an input signal of the ET power supply with the ET signal to estimate a third delay; and
   means for estimating a delay of the ET power supply as a difference between the first delay and the third delay.

21. A method, comprising:
   applying a transmit signal to a power amplifier (PA) to generate a radio frequency (RF) output signal;
   applying an envelope tracking (ET) signal to an ET path to generate a supply voltage of the PA;
   deriving a nal from the ET path;
   correlating the derived signal with the ET signal; and
   adjusting a relative delay between the RF output signal and the supply voltage of the PA based on the correlation of the derived signal with the ET signal,
   wherein the ET path includes an ET power supply that generates the supply voltage of the PA, and wherein deriving the signal from the ET path comprises deriving the signal from an input of the ET power supply.

* * * * *

UNITED STATES PATENT AND TRADEMARK OFFICE
CERTIFICATE OF CORRECTION

PATENT NO.        : 9,066,368 B2
APPLICATION NO.   : 13/491184
DATED             : June 23, 2015
INVENTOR(S)       : Lorenz et al.

Page 1 of 1

It is certified that error appears in the above-identified patent and that said Letters Patent is hereby corrected as shown below:

In the claims

In column 12, line 35, replace "a nal from" with --a signal from--.

Signed and Sealed this
Seventeenth Day of May, 2016

Michelle K. Lee
*Director of the United States Patent and Trademark Office*